(12) United States Patent
Xu et al.

(10) Patent No.: US 10,381,355 B2
(45) Date of Patent: Aug. 13, 2019

(54) DENSE VERTICAL FIELD EFFECT TRANSISTOR STRUCTURE

(71) Applicant: International Business Machines Corporation, Armonk, NY (US)

(72) Inventors: Peng Xu, Santa Clara, CA (US); Kangguo Cheng, Schenectady, NY (US); Zhenxing Bi, Niskayuna, NY (US); Juntao Li, Cohoes, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/868,488

(22) Filed: Jan. 11, 2018

(65) Prior Publication Data

US 2019/0214392 A1    Jul. 11, 2019

(51) Int. Cl.
| | | |
|---|---|---|
| *H01L 27/11* | (2006.01) | |
| *H01L 29/66* | (2006.01) | |
| *H01L 29/78* | (2006.01) | |
| *H01L 21/8238* | (2006.01) | |

(52) U.S. Cl.
CPC .. *H01L 27/1104* (2013.01); *H01L 21/823807* (2013.01); *H01L 21/823821* (2013.01); *H01L 29/66666* (2013.01); *H01L 29/66795* (2013.01); *H01L 29/785* (2013.01); *H01L 29/7827* (2013.01)

(58) Field of Classification Search
CPC .......... H01L 27/1104; H01L 29/66795; H01L 29/66666; H01L 29/785; H01L 29/7827; H01L 21/823821; H01L 21/823807

USPC ............... 257/291, 329, 331, 368, 369, 379, 257/E27.062, E27.07, E27.098, E29.255, 257/E29.262, E29.131, E21.41, E21.43, 257/E21.48, E21.661; 438/268, 270, 738, 438/753

See application file for complete search history.

(56) References Cited

U.S. PATENT DOCUMENTS

| | | | |
|---|---|---|---|
| 5,168,333 A | 12/1992 | Nakagawa | |
| 8,211,809 B2* | 7/2012 | Masuoka | ................. H01L 22/26 438/734 |
| 8,319,288 B2* | 11/2012 | Masuoka | .......... H01L 21/82382 257/369 |
| 8,373,235 B2* | 2/2013 | Masuoka | ............ H01L 27/0886 257/368 |
| 8,431,980 B2 | 4/2013 | Voshell | |
| 8,497,548 B2* | 7/2013 | Masuoka | .......... H01L 21/82388 257/329 |
| 8,901,667 B2 | 12/2014 | Jagannathan | |

(Continued)

*Primary Examiner* — Dao H Nguyen
(74) *Attorney, Agent, or Firm* — Cantor Colburn LLP; Vazken Alexanian

(57) ABSTRACT

A configuration of components formed on a semiconductor structure is provided. A non-limiting example of the configuration includes a substrate having a first section doped with a first dopant and a second section doped with a second dopant. The configuration further includes an insulator interposed between the first and second sections. A first fin extends upwardly from the first section, and second and third fins extend upwardly from the second section. A conductor is configured to be shared between proximal gates operably interposed between the first and second fins. A dielectric material is configured to separate proximal gates operably interposed between the second and third fins.

17 Claims, 4 Drawing Sheets

(56) References Cited

U.S. PATENT DOCUMENTS

| | | |
|---|---|---|
| 9,153,594 B2 | 10/2015 | Jain |
| 9,373,641 B2 | 6/2016 | Anderson |
| 9,406,775 B1 | 8/2016 | Bouche |
| 2005/0072988 A1 | 4/2005 | Augusto |
| 2007/0007601 A1 | 1/2007 | Hsu |
| 2015/0155286 A1 | 6/2015 | Chuang |
| 2015/0340461 A1 | 11/2015 | Wei |
| 2016/0247730 A1 | 8/2016 | You |
| 2016/0293496 A1 | 10/2016 | Kim |
| 2018/0122938 A1* | 5/2018 | Cheng ................ H01L 29/7827 |

* cited by examiner

DENSE VERTICAL FIELD EFFECT TRANSISTOR STRUCTURE

BACKGROUND

The present invention generally relates to fabrication of electronic components and more specifically formation of dense vertical field effect transistor (VFET) structures for static random-access memory (SRAM).

Complementary metal-oxide-semiconductor (CMOS) refers to integrated circuit (IC) technology uses a combination of p-type and n-type metal-oxide-semiconductor field-effect transistors (MOSFETs) to implement logic gates and other digital circuits. CMOS components are used in digital logic circuits such as microprocessors, microcontrollers, SRAM and the like. CMOS components are also used in analog circuits such as image sensors (or CMOS sensors), data converters and highly integrated transceivers for many types of communication systems.

SUMMARY

Embodiments of the present invention are directed to a configuration of components. A non-limiting example of the configuration includes a substrate having a first section doped with a first dopant and a second section doped with a second dopant. The configuration further includes an insulator interposed between the first and second sections. A first fin extends upwardly from the first section, and second and third fins extend upwardly from the second section. A conductor is configured to be shared between proximal gates operably interposed between the first and second fins. A dielectric material is configured to separate proximal gates operably interposed between the second and third fins.

Embodiments of the present invention are directed to a configuration of components. A non-limiting example of the configuration includes a substrate having a first section doped with a first dopant and a second section doped with a second dopant. The configuration further includes an insulator interposed between the first and second sections. A first fin extends upwardly from the first section, and second and third fins extend upwardly from the second section. A shared gate region is operably interposed between the first and second fins. A gate separation region is operably interposed between the second and third fins.

Embodiments of the present invention are directed to a method of forming a dense VFET semiconductor structure. A non-limiting example of the method includes extending a first fin upwardly from a first section of a substrate which is doped with a first dopant, and extending second and third fins upwardly from a second section of the substrate which is doped with a second dopant and which is insulated from the first section. A conductor configured to be shared between proximal gates is interposed between the first and second fins. A dielectric material configured to separate proximal gates is operably interposed between the second and third fins.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
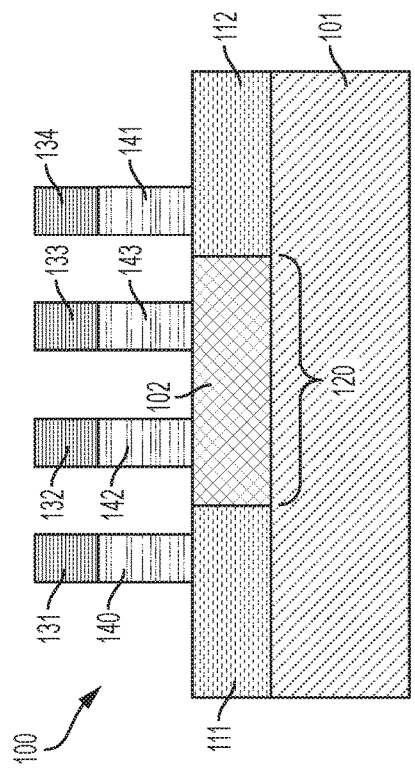
FIG. 1 is a schematic side view of a semiconductor structure with a hard mask in accordance with embodiments of the invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" can be understood to include any integer number greater than or equal to one, i.e. one, two, three, four, etc. The terms "a plurality" can be understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. Accordingly, in the interest of brevity, many conventional implementation details are only mentioned briefly herein or are omitted entirely without providing the well-known system and/or process details.

Turning now to an overview of technologies that are more specifically relevant to aspects of the invention, the reduction of the sizes of CMOS components has long been a goal in semiconductor chip fabrication technologies. One recent approach to the problem of CMOS size reduction has been the development of VFETs, in which the metal gate is typically formed along sidewalls of vertical fins formed on underlying semiconductor substrates. Often, such VFETs are or have to be designed with proximal static random-access memory (SRAM) on a given wafer. Normally, in dense SRAM configurations, a gate is shared on NFET/PFET fins but an additional or different gate is needed for interposition between adjacent fins that share a same bottom source and drain structure. The formation or fabrication process to form or fabricate this additional or different gate can be difficult, however, due to the small pitch of various components (e.g., VFET fins) in the dense SRAM configurations.

Turning now to an overview of the aspects of the invention, one or more embodiments of the invention address the above-described shortcomings of the prior art by providing a configuration of IC elements formed on a semiconductor structure, which includes a substrate having a first section doped with a first dopant and a second section doped with a second dopant. The semiconductor structure further includes an insulator interposed between the first and second sections. In addition, the semiconductor structure includes a first fin extending upwardly from the first section and second and third fins extending upwardly from the second section. A conductor is configured to be shared between proximal gates operably interposed between the first and second fins. A dielectric material is configured to separate proximal gates operably interposed between the second and third fins.

The above-described aspects of the invention address the shortcomings of the prior art by providing for a method of cutting a gate first to form a semiconductor structure with a configuration of components exhibiting a dense SRAM structure with VFETs. The resulting dense SRAM structure has a uniform work function metal (WFM) around VFET fins, a gate cut between adjacent fins with tight fin pitch, tungsten (W) fill between WFM in a shared gate region and an insulator fill between WFM in non-shared gate regions. Turning now to a more detailed description of aspects of the present invention, FIG. 1 is a schematic side view of a configuration of IC elements being formed on a semiconductor structure 100 after an initial sequence of fabrication operations. At this stage of fabrication, the semiconductor structure 100 has a substrate 101, a doped layer 102, a semiconductor layer 103 and a hard mask 104. The doped layer 102 is positioned vertically between the substrate 101 and the semiconductor layer 103. The semiconductor structure 100 can also be formed into a first section 110 and a second section 120. The first section 110 can be provided as a pair of sub-sections 111 and 112 which are doped with a first dopant. The second section 120 is interposed between the pair of sub-sections 111 and 112 and is doped with a second dopant.

In accordance with embodiments, the first dopant can be an n-type dopant and the second dopant can be a p-type dopant. Alternatively, the first dopant can be a p-type dopant and the second dopant can be an n-type dopant. For purposes of clarity and brevity, the description provided herein will relate to the example in which the pair of sub-sections 111 and 112 are doped with n-type dopant and the second section 120 is doped with p-type dopant. In some embodiments, the doping concentration ranges from about $1\times10^{19}$ atoms/cm$^3$ to about $2\times10^{21}$ atoms/cm$^3$, although lower or higher doping concentrations are also conceived.

The semiconductor layer 103 can be formed of any one or more semiconductor materials (e.g., silicon, silicon germanium, germanium, III-V compound semiconductor, II-V compound semiconductor) but, for purposes of clarity and brevity, the description provided herein will relate to the example in which the semiconductor layer 103 is formed of silicon (Si). For Si, the n-type dopant can be selected from a group of phosphorus (P), arsenic (As) and antimony (Sb) and the p-type dopant can be selected from a group of boron (B), boron fluoride (BF2), gallium (Ga), indium (In) and thallium (Tl). Sub-sections 111 and 112 and the second section 102 can be doped semiconductor. In some embodiments, sub-sections 111 and 112 can be phosphorus-doped silicon and the second section 120 can be boron doped silicon germanium. The substrate 101 can include additional elements such as doped regions (or so-called "wells"). In accordance with embodiments, doping techniques can include ion implantation, gas phase doping, plasma doping, plasma immersion ion implantation, cluster doping, infusion doping, liquid phase doping, solid phase doping, etc. The structures shown in FIG. 1 can be formed by a combination of epitaxy growth and patterning techniques. In some embodiments, the doped sub-sections 111 and 112 are formed by in-situ doped epitaxy ("in-situ" means dopants are incorporated in the epitaxy layer during epitaxy growth). The semiconductor layer 103 on top of the sub-sections 111 and 112 are formed by epitaxy. In some embodiment, the semiconductor layer 103 is undoped.

The hard mask 104 can be provided as a plurality of hard mask elements 131, 132, 133 and 134 that are located at positions where fins are to be formed during later processing. The hard mask elements 131, 132, 133 and 134 can be formed of silicon nitride (SiN) or another similar material or any suitable combination of different materials and can be provided as a pair of first hard mask elements 131 and 134 associated with the pair of sub-sections 111 and 112, respectively, and second and third hard mask elements 132 and 133 associated with the second section 120. In some embodiments, the hard mask 104 is formed by deposition followed by patterning. After deposition of the hard mask 104, the hard mask 104 is patterned, for example, by lithography followed by etching. Other suitable techniques, such as sidewall image transfer (SIT), self-aligned double patterning (SADP), self-aligned quadruple patterning (SAQP) can be used to pattern the hard mask 104.

Figure 2:
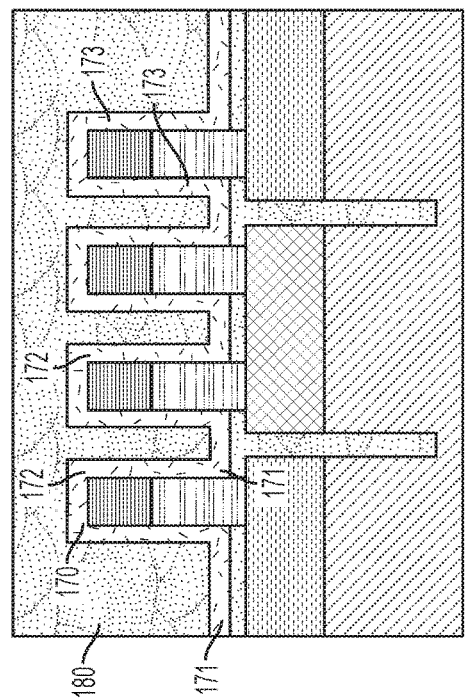
FIG. 2 is a schematic side view of the semiconductor structure of FIG. 1 with a pair of first fins in a pair of sub-sections of a first section and second and third fins in a second section in accordance with embodiments of the invention.

FIG. 2 is a schematic side view of the semiconductor structure 100 of FIG. 1 after a fabrication operation according to embodiments of the invention. As shown in FIG. 2, a Si fin etch process has been executed to thereby form a pair of first fins (hereinafter referred to as "first and fourth fins") 140 and 141 in the pair of sub-sections 111 and 112 of the first section 110 and to thereby form second and third fins 142 and 143 in the second section 120. The first fin 140 extends upwardly from an uppermost surface of the sub-section 111, the fourth fin 141 extends upwardly from an uppermost surface of the sub-section 112 and the second and third fins 142 and 143 extend upwardly from an uppermost surface of the second section 120. The first fin 140 and the second fin 142 are proximal with one another, the second and third fins 142 and 143 are proximal with one another and the third fin and the fourth fin 141 are proximal with one another.

Figure 3:
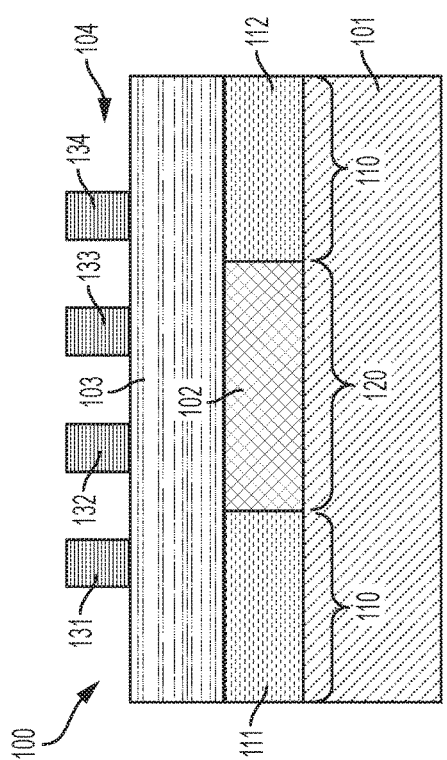
FIG. 3 is a schematic side view of the semiconductor structure of FIG. 2 with insulation between the second section and the pair of sub-sections of the first section and a bottom spacer in accordance with embodiments of the invention.

FIG. 3 is a schematic side view of the semiconductor structure 100 of FIG. 2 following deep shallow trench isolation (STI) processing, oxide filling and oxide recession. As shown in FIG. 3, the semiconductor structure 100 includes insulation 150 and first-fifth bottom spacers 160-164. The insulation 150 can be formed of dielectric material or, more particularly, oxide, and extends downwardly between the second section 120 and the pair of sub-sections 111 and 112 and into the substrate 101. The first-fifth bottom spacers 160-164 can be formed of dielectric material, for example, silicon oxide, silicon nitride, or silicon oxynitride. The first and fifth bottom spacers 160 and 164 are disposed at an exterior of the first and fourth fins 140 and 141, the second bottom spacer 161 is interposed between the first fin 140 and the second fin 142, the third bottom spacer 162 is interposed between the second fin 142 and the third fin 143 and the fourth bottom spacer 163 is interposed between the third fin 143 and the fourth fin 141. The first-fifth bottom spacers 160-164 can have substantially coplanar uppermost surfaces.

In accordance with embodiments, the first-fifth bottom spacers 160-164 can be formed by any suitable technique, such as directional high-density plasma (HDP) deposition.

Figure 4:
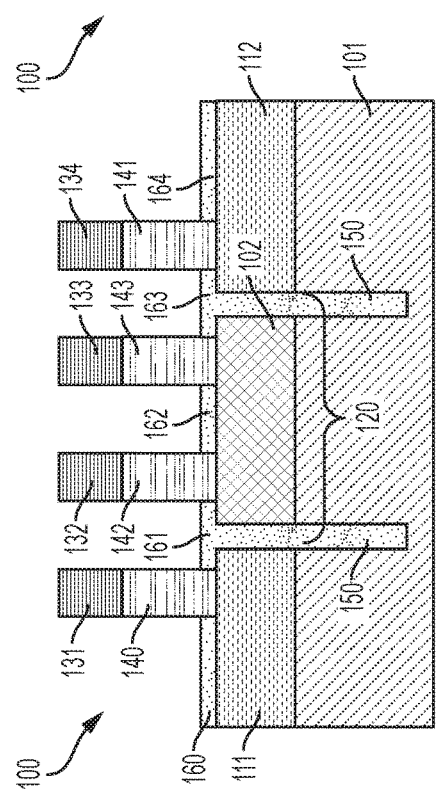
FIG. 4 is a schematic side view of the semiconductor structure of FIG. 3 with a liner and dielectric material deposited thereon in accordance with embodiments of the invention.

FIG. 4 is a schematic side view of the semiconductor structure 100 of FIG. 3 following liner and dielectric material depositions. As shown in FIG. 4, the liner deposition forms a liner 170 along the uppermost surfaces of the first-fifth bottom spacers 160-164 (see FIG. 3), sidewalls of the first-fourth fins 140-143 (see FIG. 3) and exterior surfaces of the hard mask elements 131, 132, 133 and 134 (see FIG. 3) whereas the dielectric material deposition fills in spaces around and above the liner 170 to form a dielectric material body 180. The liner 170 can be formed of silicon carbon oxygen (SiCO) or another similar material. The dielectric material body 180 can be formed of silicon boron carbon nitrogen (SiBCN). Other material choices of the liner 170 and the dielectric material body 180 are possible as long as there is etch selectivity between those two materials. The liner 170 includes lower horizontal liner portions 171, upper horizontal liner portions 172 and vertical liner portions 173. The lower horizontal liner portions 171 lie along uppermost surfaces of the first-fifth bottom spacers 160-164, the upper horizontal liner portions 172 lie along uppermost surfaces of the hard mask elements 131, 132, 133 and 134 and the vertical liner portions 173 abut the sidewalls of the first-fourth fins 140-143 and the lateral exterior surfaces of the hard mask elements 131, 132, 133 and 134.

Figure 5:
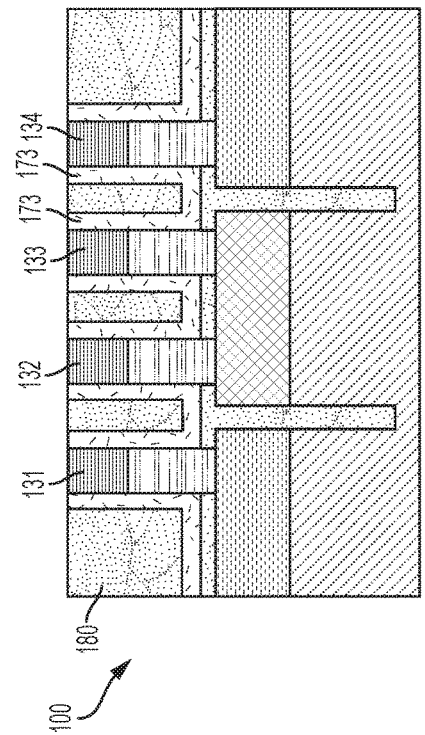
FIG. 5 is a schematic side view of the semiconductor structure of FIG. 4 following an execution of a polishing operation in accordance with embodiments of the invention.

FIG. 5 is a schematic side view of the semiconductor structure 100 of FIG. 4 following an execution of a polishing operation. The polishing operation can be executed as a chemical mechanical polishing (CMP) operation or another similar process and results in a planarization of the semiconductor structure 100 such that newly formed uppermost surfaces of the dielectric material body 180, the vertical liner portions 173 and the hard mask elements 131, 132, 133 and 134 are exposed.

Figure 6:
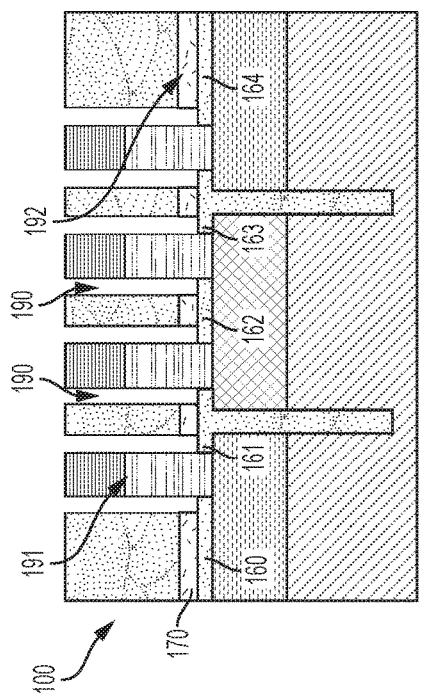
FIG. 6 is a schematic side view of the semiconductor structure of FIG. 5 following an executing of an etching operation to form trenches in accordance with embodiments of the invention.

FIG. 6 is a schematic side view of the semiconductor structure 100 of FIG. 5 following an executing of an etching operation. The etching operation can be executed as a directional etch of the liner 170 such that only the vertical liner portions 173 are removed. Thus, as a result of the etching operation, trenches 190 are formed between sidewalls of fin-hard mask pairs 191 and dielectric material body-lower horizontal liner portion pairs 192. The trenches 190 extend to the first-fifth bottom spacers 160-164.

Figure 7:
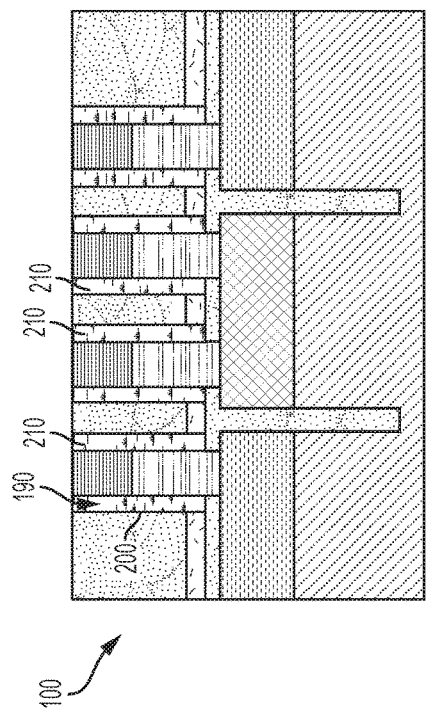
FIG. 7 is a schematic side view of the semiconductor structure of FIG. 6 following film deposition and work function metal filling operations in accordance with embodiments of the invention.

FIG. 7 is a schematic side view of the semiconductor structure 100 of FIG. 6 following film deposition and WFM filling operations. The film deposition operation results in the formation of a film 200 of dielectric material along interior surfaces of the trenches 190 and the WFM filling operation results in the remainders of the trenches being filled with WFM layers 210.

Figure 8:
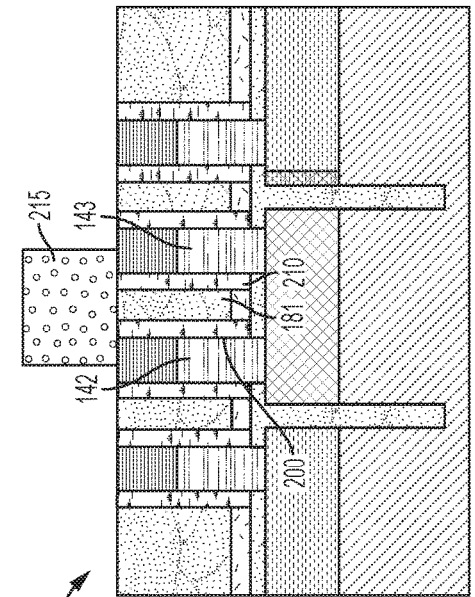
FIG. 8 is a schematic side view of the semiconductor structure of FIG. 7 following formation of a mask in accordance with embodiments of the invention.

In accordance with embodiments, the film 200 can be formed of or provided as a gate dielectric. The film 200 can be silicon oxide, silicon nitride, silicon oxynitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum, aluminum, magnesium. The gate dielectric of the film 200 can be deposited by any suitable technique, for example, atomic layer deposition (ALD), chemical vapor deposition (CVD), etc. The materials of the WFM layers 210 can include nitride including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN), a carbide including but not limited to titanium carbide (TiC) titanium aluminum carbide (TiAlC), tantalum carbide (TaC), hafnium carbide (HfC), and combinations thereof. FIG. 8 is a schematic side view of the semiconductor structure 100 of FIG. 7 following a formation of a mask 215. The mask 215 can be provided prior to execution of gate cut patterning operations. The mask 215 can extend over the second and third fins 142 and 143 so as to cover and preserve at least the remaining portion of the dielectric material body 180, which is interposed between the second and third fins 142 and 143 and which can be identified as dielectric material filling 181, as well as the corresponding portions of the film 200 and the corresponding ones of the WFM layers 210 during the execution of the gate cut patterning operations.

Figure 9:
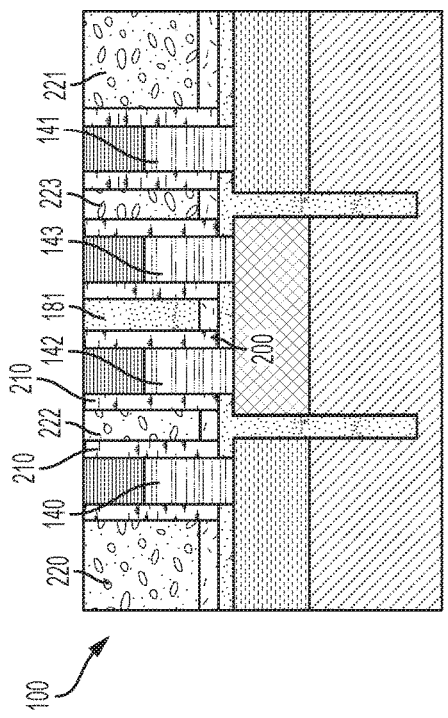
FIG. 9 is a schematic side view of the semiconductor structure of FIG. 8 following an etching operation in accordance with embodiments of the invention.
Figure 10:
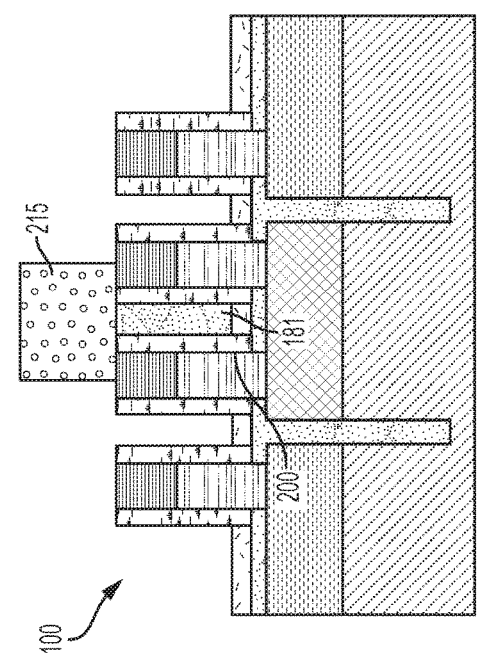
FIG. 10 is a schematic side view of the semiconductor structure of FIG. 9 following a conductor filling operation in accordance with embodiments of the invention.

FIG. 9 is a schematic side view of the semiconductor structure 100 of FIG. 8 following an etching operation by which the remaining portions of the dielectric material body 180 that are not covered by the mask 215 (and are thus exposed) are removed and by which the exposed portions of the film 200. FIG. 10 is a schematic side view of the semiconductor structure 100 of FIG. 9 following removal of the mask 215 (see FIG. 9) and a conductor filling operation. The conductor filling operation can be executed, for example, as a tungsten (W) filling operation and results in conductive W fillings 220 and 221 being provided at exteriors of the first and fourth fins 140 and 141, respectively, and in conductive W fillings 222 and 223 being provided between the first fin 140 and the second fin 142 and between the third fin 143 and the fourth fin 141, respectively. Besides tungsten for the W fillings 222, other conductor materials can be used for fillings. These include but are not limited to titanium, tantalum, ruthenium, zirconium, cobalt, aluminum, platinum and silver. The alternative filling materials can be deposited by any suitable technique such as, for example, ALD, CVD, PVD, plating, etc.

As shown in FIG. 10, because the etching operation described above with reference to FIG. 9 removes the portions of the film 200 exposed by the mask 215, the interior surfaces of the conductive W fillings 220 and 221 make direct contact with exterior surfaces of the complementary portions of the film 200 and the interior and exterior surfaces of the conductive W fillings 222 and 223 make direct contact with exterior and interior surfaces of the complementary portions of the film 200. Thus, in the absence of intervening portions of the film 200, contact resistance between the WFM layers 210 and the conductive W fillings 220, 221, 222 and 223 can be improved.

Figure 11:
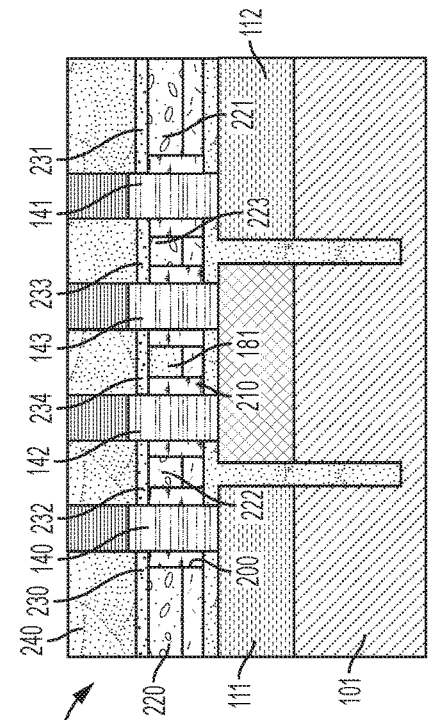
FIG. 11 is a schematic side view of the semiconductor structure of FIG. 10 following a recession of work function metal, a conductor and dielectric material in accordance with embodiments of the invention.

FIG. 11 is a schematic side view of the semiconductor structure 100 of FIG. 10 following a recession of the film 200, the WFM layers 210, the conductive W fillings 220, 221, 222 and 223 and, in some cases, the dielectric material filling 181. As shown in FIG. 11, newly formed respective uppermost surfaces of the film 200, the WFM layers 210, the conductive W fillings 220, 221, 222 and 223 and the dielectric material filling 181 are substantially coplanar and have a height such that the first-fourth fins 140-143 and the hard mask elements 131, 132, 133 and 134 (see FIG. 5) extend upwardly from the newly formed respective uppermost surfaces.

In accordance with embodiments of the present invention, the recession can be controlled so as to leave the dielectric material filling 181 intact. In these cases, a final structure of the semiconductor structure 100 will differ in that the dielectric material filling 181 will cut a fifth bottom spacer 164 (to be described below) into two parts. For purposes of clarity and brevity, however, the description provided herein will relate to the case in which the dielectric material filling 181 is recessed.

Figure 12:
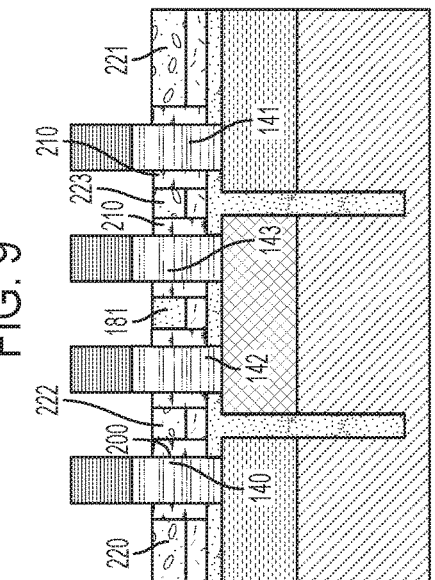
FIG. 12 is a schematic side view of the semiconductor structure of FIG. 11 following spacer deposition, dielectric material filling and polishing in accordance with embodiments of the invention.

FIG. 12 is a schematic side view of the semiconductor structure 100 of FIG. 11 following spacer deposition, dielectric material filling and polishing. As shown in FIG. 11, the spacer deposition results in the formation of first and second bottom spacers 230 and 231, third and fourth bottom spacers 232 and 233 and a fifth bottom spacer 234. The first and second bottom spacers 230 and 231 are formed over the conductive W fillings 220 and 221 and over the corresponding portions of the WFM layers 210 and the film 200 at exteriors of the first and fourth fins 140 and 141. The third and fourth bottom spacers 232 and 233 are formed over the conductive W fillings 222 and 223 and over the corresponding portions of the WFM layers 210 and the film 200 between the first fin 140 and the second fin 142 and between the third fin 143 and the fourth fin 141. The fifth bottom spacer 234 is formed over the dielectric material filling 181 and over the corresponding portions of the WFM layers 210 and the film 200 between the second fin 142 and the third fin 143. The dielectric material filling results in dielectric material pillars 240 being formed over the first-fifth bottom spacers 230-234. The polishing can be executed as a CMP operation and results in a planarization of respective upper surfaces of the dielectric material pillars 240 and the hard mask elements 131, 132, 133 and 134 (see FIG. 5).

As shown in FIG. 12, the semiconductor structure 100 includes the substrate 101 having the pair of sub-sections 111 and 112 of the first section 110 (see FIG. 3) which are doped with the first dopant (e.g., n-type dopant) and the second section 120 (see FIG. 3) doped with the second dopant (e.g., p-type dopant). The semiconductor structure 100 further includes insulation 150 (see FIG. 3) and first-fifth bottom spacers 160-164 (see FIG. 6) such that the insulation 150 is interposed between the pair of sub-sections 111 and 112 of the first section 110 and the second section 120. In addition, the semiconductor structure 100 includes the first fin 140 and the fourth fin 141 extending upwardly from the pair of sub-sections 111 and 112 of the first section 110 and second and third fins 142 and 143 extending upwardly from the second section 120. The semiconductor structure 100 also includes at least the conductive W fillings 222 and 223 and the dielectric material filling 181. The conductive W fillings 222 and 223 are configured to be shared between proximal gates (to be described below) operably interposed between the first fin 140 and the second fin 142 and between the third fin 143 and the fourth fin 141. The dielectric material filling 181 is configured to separate proximal gates (to be described below) operably interposed between the second fin 142 and the third fin 143.

As further shown in FIG. 12, the conductive W fillings 222 and 223 are disposed between complementary portions of WFM layers 210 and the insulating dielectric material filling 181 is disposed between complementary portions of WFM layers 210. In addition, the WFM layers 210 can have a substantially uniform thickness.

Figure 13:
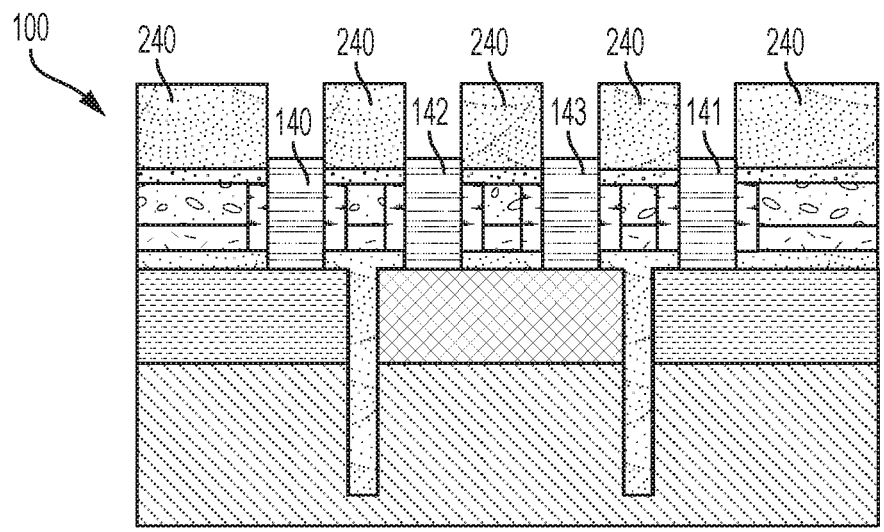
FIG. 13 is a schematic side view of the semiconductor structure of FIG. 12 following removal of spacer material in accordance with embodiments of the invention.

FIG. 13 is a schematic side view of the semiconductor structure 100 of FIG. 12 following removal of spacer material. As shown in FIG. 13, the removal of spacer material results in the removal of the hard mask elements 131, 132, 133 and 134 (see FIG. 5) while the dielectric material pillars 240 remain and expose the respective uppermost surfaces of the first fin 140, the fourth fin 141, the second fin 142 and the third fin 143.

Figure 14:
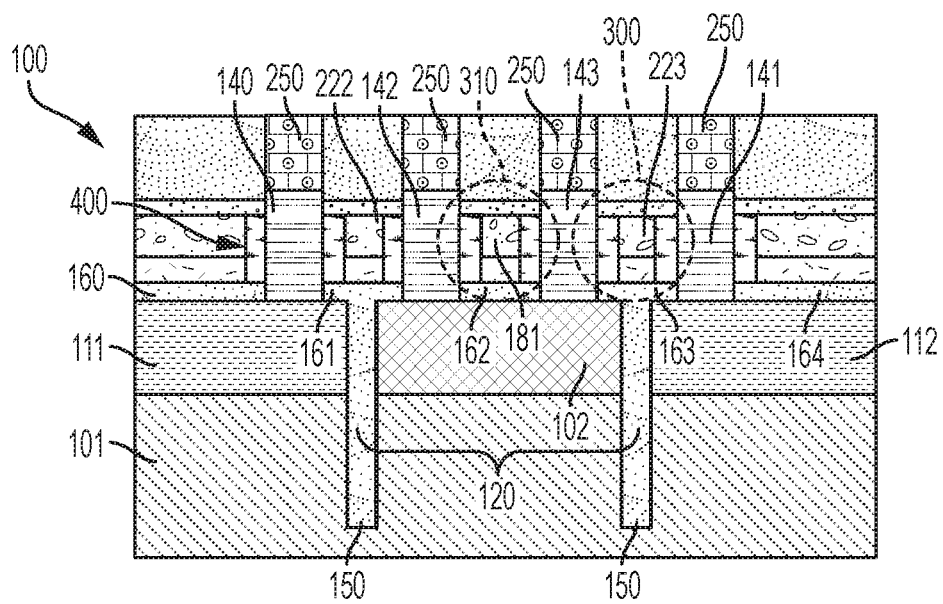
FIG. 14 is a schematic side view of the semiconductor structure of FIG. 13 following epitaxial growth in accordance with embodiments of the invention.

FIG. 14 is a schematic side view of the semiconductor structure 100 of FIG. 13 following epitaxial growth which results in the formation of epitaxy 250 above and in contact with the first fin 140, the fourth fin 141, the second fin 142 and the third fin 143.

As shown in FIG. 14, the semiconductor structure 100 includes the substrate 101 having the pair of sub-sections 111 and 112 of the first section 110 which are doped with the first dopant (e.g., n-type dopant) and the second section 120 doped with the second dopant (e.g., p-type dopant). The semiconductor structure 100 further includes insulation 150 and first-fifth bottom spacers 160-164 such that the insulation 150 is interposed between the pair of sub-sections 111 and 112 of the first section 110 and the second section 120. In addition, the semiconductor structure 100 includes the first fin 140 and the fourth fin 141 extending upwardly from the pair of sub-sections 111 and 112 of the first section 110 and second and third fins 142 and 143 extending upwardly from the second section 120. The semiconductor structure 100 also includes shared gate regions 300 and a gate separation region 310. The shared gate regions 300 are operably interposed between the first fin 140 and the second fin 142 and between the third fin 143 and the fourth fin 141. The gate separation region 310 is operably interposed between the second fin 142 and the third fin 143.

As further shown in FIG. 14, the semiconductor structure 100 includes at least conductive W fillings 222 and 223 disposed between complementary portions of WFM layers 210 in the shared gate region 300 and an insulating dielectric material filling 181 disposed between complementary portions of WFM layers 210 in the gate separation region 210. In addition, the WFM layers 210 can have a substantially uniform thickness.

In accordance with embodiments, the above-described features cooperatively form vertical field effect transistors (VFETs) 400 at each of the first fin 140, the fourth fin 141, the second fin 142 and the third fin 143.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

What is claimed is:

1. A semiconductor structure, comprising:
    a substrate having a first section doped with a first dopant and a second section doped with a second dopant;
    an insulator interposed between the first and second sections;
    a first fin extending upwardly from the first section;
    second and third fins extending upwardly from the second section;
    a conductor configured to be shared between proximal gates operably interposed between the first and second fins; and
    a dielectric material configured to separate proximal gates operably interposed between the second and third fins,
    wherein:
    the first section is provided as a pair of sub-sections between which the second section is interposed;
    the insulator is provided as a pair of insulators interposed between the second section and each of the pair of sub-sections;
    the first fin is provided as a pair of first fins extending upwardly from each of the pair of sub-sections, respectively; and
    the conductor is provided as a pair of conductors of which one is operably interposed between one of the pair of first fins and the second fin and the other is operably interposed between the other of the pair of first fins and the third fin.

2. The semiconductor structure according to claim 1, wherein the first dopant comprises one of an n-type or a p-type dopant and the second dopant comprises the other one of the n-type or the p-type dopant.

3. The semiconductor structure according to claim 2 further comprising vertical field effect transistors (VFETs) at each of the first, second and third fins.

4. The semiconductor structure according to claim 1 further comprising a uniform layer of work function metal (WFM) around each of the first, second and third fins.

5. A semiconductor structure comprising:
a substrate having a first section doped with a first dopant and a second section doped with a second dopant;
an insulator interposed between the first and second sections;
a first fin extending upwardly from the first section;
second and third fins extending upwardly from the second section;
a shared gate region operably interposed between the first and second fins; and
a gate separation region operably interposed between the second and third fins,
wherein:
the first section is provided as a pair of sub-sections between which the second section is interposed;
the insulator is provided as a pair of insulators interposed between the second section and each of the pair of sub-sections;
the first fin is provided as a pair of first fins extending upwardly from each of the pair of sub-sections, respectively; and
the shared gate region is provided as a pair of shared gate regions of which one is operably interposed between one of the pair of first fins and the second fin and the other is operably interposed between the other of the pair of first fins and the third fin.

6. The semiconductor structure according to claim 5 further comprising:
a conductive filler disposed between complementary portions of work function metal (WFM) in the shared gate region; and
an insulator disposed between complementary portions of WFM in the gate separation region.

7. The semiconductor structure according to claim 6, wherein the conductive filler comprises tungsten (W) and the insulator comprises a dielectric material.

8. The semiconductor structure according to claim 5, wherein the first dopant comprises one of an n-type or a p-type dopant and the second dopant comprises the other one of the n-type or the p-type dopant.

9. The semiconductor structure according to claim 8 further comprising vertical field effect transistors (VFETs) at each of the first, second and third fins.

10. The semiconductor structure according to claim 5 further comprising a uniform layer of work function metal (WFM) around each of the first, second and third fins.

11. A method of forming a dense vertical field effect transistor (VFET) semiconductor structure, the method comprising:
extending a first fin upwardly from a first section of a substrate which is doped with a first dopant;
extending second and third fins upwardly from a second section of the substrate which is doped with a second dopant and which is insulated from the first section;
operably interposing a conductor configured to be shared between proximal gates between the first and second fins; and
operably interposing a dielectric material configured to separate proximal gates between the second and third fins,
wherein:
the extending of the first fin comprises extending a pair of first fins from a pair of sub-sections of the first section between which the second section is interposed; and
the operably interposing of the conductor comprises operably interposing the conductor between one of the pair of first fins and the second fin and operably interposing the conductor between the other of the pair of first fins and the third fin.

12. The method according to claim 11, wherein the first dopant comprises one of an n-type or a p-type dopant and the second dopant comprises the other one of the n-type or the p-type dopant.

13. The method according to claim 11, further comprising forming vertical field effect transistors (VFETs) at each of the first, second and third fins.

14. A method of forming a dense vertical field effect transistor (VFET) semiconductor structure, the method comprising:
extending a first fin upwardly from a first section of a substrate which is doped with a first dopant;
extending second and third fins upwardly from a second section of the substrate which is doped with a second dopant and which is insulated from the first section;
operably interposing a conductor configured to be shared between proximal gates between the first and second fins; and
operably interposing a dielectric material configured to separate proximal gates between the second and third fins,
wherein the operably interposing of the dielectric material between the second and third fins comprises:
depositing a liner over at least exterior surfaces of the first, second and third fins;
depositing the dielectric material over the liner;
etching the liner along sidewalls of the first, second and third fins to form trenches between the dielectric material and the sidewalls of the first, second and third fins;
lining the trenches with high-k dielectric material; and
filling remainders of the trenches with work function metal (WFM).

15. A method of forming a dense vertical field effect transistor (VFET) semiconductor structure, the method comprising:
extending a first fin upwardly from a first section of a substrate which is doped with a first dopant;
extending second and third fins upwardly from a second section of the substrate which is doped with a second dopant and which is insulated from the first section;
operably interposing a conductor configured to be shared between proximal gates between the first and second fins; and
operably interposing a dielectric material configured to separate proximal gates between the second and third fins,
wherein the operably interposing of the dielectric material between the second and third fins comprises:
forming a mask over the dielectric material;
etching unmasked dielectric material to form conductor locations; and
filling the conductor locations with a conductor.

16. The method according to claim 15, wherein the forming of the mask comprises forming the mask to extend over respective portions of the second and third fins.

17. A method of forming a dense vertical field effect transistor (VFET) semiconductor structure, the method comprising:
- extending a first fin upwardly from a first section of a substrate which is doped with a first dopant;
- extending second and third fins upwardly from a second section of the substrate which is doped with a second dopant and which is insulated from the first section;
- operably interposing a conductor configured to be shared between proximal gates between the first and second fins; and
- operably interposing a dielectric material configured to separate proximal gates between the second and third fins, wherein the method further comprises:
- recessing work function metal (WFM), a conductor and dielectric material from between and around the first, second and third fins to form recessions;
- depositing bottom spacer material in the recessions;
- filling remainders of the recessions with dielectric material;
- polishing the bottom spacer and dielectric materials;
- removing exposed bottom spacer material; and
- executing epitaxial growth at spaces from which the exposed bottom spacer material is removed.

* * * * *